(12) United States Patent
Shreter et al.

(10) Patent No.: US 9,948,065 B2
(45) Date of Patent: Apr. 17, 2018

(54) SEMICONDUCTOR LIGHT-EMITTING DEVICE WITH AN AXIS OF SYMMETRY

(71) Applicants: Yury Georgievich Shreter, Saint-Petersburg (RU); Yury Toomasovich Rebane, Saint-Petersburg (RU); Aleksey Vladimirovich Mironov, Saint-Petersburg (RU)

(72) Inventors: Yury Georgievich Shreter, Saint-Petersburg (RU); Yury Toomasovich Rebane, Saint-Petersburg (RU); Aleksey Vladimirovich Mironov, Saint-Petersburg (RU)

( * ) Notice: Subject to any disclaimer, the term of this patent is extended or adjusted under 35 U.S.C. 154(b) by 0 days.

(21) Appl. No.: 15/123,381

(22) PCT Filed: Mar. 5, 2015

(86) PCT No.: PCT/RU2015/000137
§ 371 (c)(1),
(2) Date: Sep. 2, 2016

(87) PCT Pub. No.: WO2015/133936
PCT Pub. Date: Sep. 11, 2015

(65) Prior Publication Data
US 2017/0110853 A1    Apr. 20, 2017

(30) Foreign Application Priority Data
Mar. 5, 2014  (RU) ................ 2014108564

(51) Int. Cl.
*F21V 9/16* (2006.01)
*H01S 5/40* (2006.01)
(Continued)

(52) U.S. Cl.
CPC .............. *H01S 5/4043* (2013.01); *F21V 9/16* (2013.01); *H01S 5/2031* (2013.01); (Continued)

(58) Field of Classification Search
CPC ... H01S 5/4043; H01S 5/4018; F21Y 2115/30
(Continued)

(56) References Cited

U.S. PATENT DOCUMENTS

| 4,280,108 A | 7/1981 | Scifres et al. |
| 5,343,490 A | 8/1994 | McCall |

(Continued)

FOREIGN PATENT DOCUMENTS

| DE | 10039435 A1 | 2/2002 |
| EP | 2045889 A2 | 4/2009 |

(Continued)

OTHER PUBLICATIONS

Denault, Kristin A., et al., "Efficient and stable laser-driven white lighting", AIP Advances 3, 072107 (2013).
(Continued)

*Primary Examiner* — Paultep Savusdiphol
(74) *Attorney, Agent, or Firm* — Hoffmann & Baron, LLP

(57) ABSTRACT

The present invention proposes a semiconductor light-emitting device having an axis of symmetry, the device including two or more laser diodes, each of the laser diodes has an axis of symmetry, wherein the laser diodes are arranged in series on the axis of symmetry of the light-emitting device in such a way that their axes of symmetry coincide, wherein faces of the laser diodes are connected so that they are in electric and mechanic contact and form a bar of the laser diodes, a directional pattern of radiation thereof has an axis of symmetry coinciding with the axis of symmetry of the light-emitting device. The proposed light-emitting device can be used in laser lamps of white light for exciting phosphors since it provides a high degree of flare of cylindrical surfaces.

18 Claims, 9 Drawing Sheets

(51) Int. Cl.
  *H01S 5/20* (2006.01)
  *H01S 5/343* (2006.01)
  *F21Y 115/30* (2016.01)

(52) U.S. Cl.
  CPC ........ *H01S 5/34333* (2013.01); *H01S 5/4018* (2013.01); *F21Y 2115/30* (2016.08)

(58) Field of Classification Search
  USPC .................................. 362/84, 225, 227, 259
  See application file for complete search history.

(56) References Cited

U.S. PATENT DOCUMENTS

| | | | |
|---|---|---|---|
| 6,134,257 | A | 10/2000 | Capasso et al. |
| 6,333,944 | B1 | 12/2001 | Capasso et al. |
| 6,519,271 | B2 | 2/2003 | Kwon et al. |
| 6,577,661 | B1 | 6/2003 | Wang et al. |
| 8,326,098 | B2 | 12/2012 | Mandorlo et al. |
| 2003/0058908 | A1 | 3/2003 | Griffel |
| 2008/0056314 | A1* | 3/2008 | Coleman ............. H01S 5/02484 372/36 |
| 2011/0163292 | A1 | 7/2011 | Wang et al. |
| 2013/0001627 | A1* | 1/2013 | Kinoshita ............. H01L 33/647 257/98 |
| 2013/0207139 | A1 | 8/2013 | Weidner et al. |

FOREIGN PATENT DOCUMENTS

| | | |
|---|---|---|
| RU | 2150164 C1 | 5/2000 |
| RU | 2187183 C2 | 8/2002 |
| RU | 2408816 C2 | 8/2010 |
| RU | 2423764 C1 | 7/2011 |
| RU | 2455739 C2 | 9/2011 |
| RU | 2431225 C1 | 10/2011 |
| RU | 2465699 C1 | 10/2012 |

OTHER PUBLICATIONS

Written Opinion of the International Searching Authority issued in Intl. Application No. PCT/RU2015/000137 dated Aug. 26, 2015.

* cited by examiner

SEMICONDUCTOR LIGHT-EMITTING DEVICE WITH AN AXIS OF SYMMETRY

CROSS-REFERENCE TO RELATED APPLICATIONS

This application is a U.S. National Phase of International Application No. PCT/RU2015/000137, filed 5 Mar. 2015, which claims benefit of Russian Patent Application No. 2014108564, filed 5 Mar. 2014, the contents of which are incorporated herein by reference in their entirety.

TECHNICAL FIELD

The invention relates to light-emitting devices, in particular, to highly effective solid state light-emitting devices made on a base of a bar of laser diodes.

BACKGROUND ART

At the present time, bars of laser diodes are widely used for pumping powerful solid body lasers used for cutting, welding, grinding and thermal treatment of surfaces of various materials in many fields of industry and medicine. Usually a bar of laser diodes consists of a set of single strip-geometry laser diodes, arranged parallel to each other on a common substrate, which is used as a heat sink, RU2150164, RU2455739. These bars of strip-geometry laser diodes emit light in a determined direction as a set of parallel beams.

Single laser diodes with cylindrically symmetrical resonators with light extraction in any determined direction, either parallel to an axis of symmetry of the resonator, or perpendicular to the axis of symmetry were also proposed, U.S. Pat. No. 5,343,490, U.S. Pat. No. 6,134,257, U.S. Pat. No. 6,333,944, U.S. Pat. No. 6,519,271, U.S. Pat. No. 8,326,098, RU2423764, RU2431225, and also arrays of geometrically diverged in the directions perpendicular to their axes of symmetry of axially symmetric laser diodes, RU2465699, US 2011/0163292 A1.

The possibility of using laser diodes in combination with phosphor in sources of white light for illumination purposes represents a considerable interest, AIP ADVANCES 3, 072107 (2013).

To provide a small-sized laser light source capable of emitting light in various directions and having a directional pattern of a far radiation field close to axially symmetric, without forming optics, it was proposed to use a set of units of the strip-geometry laser diodes turned relative to each other in a plane perpendicular to an axis of radiation, RU 2187183, selected as a prototype.

The drawback of laser diodes and bars of laser diodes existing in the present-day is an inability to provide a homogeneous flare of phosphor in axially symmetric laser lamps when using these diodes as emitting elements in the laser source of light.

SUMMARY

To solve this problem the present invention proposes a semiconductor light-emitting device having an axis of symmetry, and including two or more laser diodes. The claimed device is characterized in that each of the laser diodes has an axis of symmetry, wherein the laser diodes are arranged in series on the axis of symmetry of the light-emitting device in such a way that their axes of symmetry coincide, wherein the faces of the laser diodes are connected so that they are in electric and mechanic contact and form a bar of laser diodes, a directional pattern of radiation thereof has an axis of symmetry coinciding with the axis of symmetry of the light-emitting device.

In preferred embodiments, each of the laser diodes includes a disc optical resonator, or a hollow optical resonator, or a ring optical resonator, or a polygonal optical resonator, or a hollow polygonal optical resonator.

In a preferred embodiment each of the laser diodes is made of III-nitrides.

The invention also proposes a laser lamp containing a phosphor characterized in that the proposed semiconductor light-emitting device is used as a source of visible or ultra-violet light for optical excitation of the phosphor.

A capability of the proposed semiconductor light-emitting device to emit light in all directions perpendicular to the axis of symmetry is used in the proposed laser lamp to provide a high degree of homogeneity of flare of cylindrically symmetric surfaces on which the phosphor is deposited.

DETAILED DESCRIPTION

This invention will become clear in terms of several embodiments given below. It should be noted, that the subsequent description of these embodiments is an illustrative one only and is not an exhaustive one.

Example 1. A Cylindrical Bar of Blue Laser Diodes Used as a Light Source in a Cylindrical Laser Lamp In this example, an axially symmetric bar of laser diodes consists of single laser diodes with a structure GaN/

$Al_{0.2}Ga_{0.8}N/GaN/In_{0.25}Ga_{0.75}N/GaN/In_{0.25}Ga_{0.75}N/GaN/Al_{0.2}Ga_{0.8}N/GaN$ with disc optical resonators.

Figure 1:
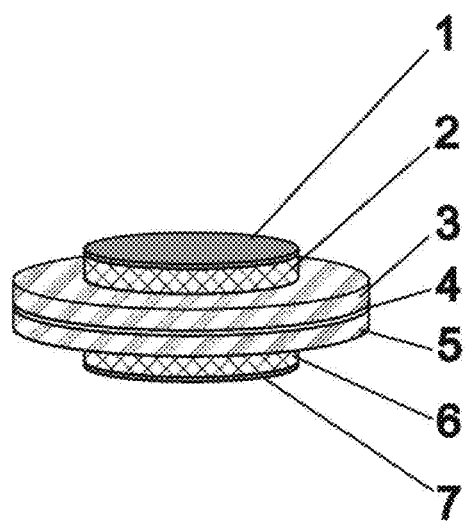
FIG. 1 shows a single laser diode with a disc optical resonator which is a component of a cylindrical bar of laser diodes shown in FIG. 2.

A single laser diode with a disc optical resonator is shown in FIG. 1. It consists of a metal n-contact 1, a contact layer 2 of n-type gallium nitride doped with silicon of concentration $5 \cdot 10^{18}$ cm$^{-3}$ and 2µ thick, a cladding 3 of solid solution $Al_{0.2}Ga_{0.8}N$ of n-type 0.5µ thick doped with silicon of concentration $10^{19}$ cm$^{-3}$, a waveguiding layer 4 of gallium nitride which includes two $In_{0.2}Ga_{0.8}N$ quantum wells 2.5 nm wide, a cladding layer 5 of solid solution $Al_{0.2}Ga_{0.8}N$ of p-type 0.5µ thick doped with magnum of concentration $5 \cdot 10^{20}$ cm$^{-3}$, a contact layer 6 of p-type gallium nitride 0.1µ thick, doped with magnum of concentration $10^{20}$ cm$^{-3}$ and a metal p-contact 7.

Figure 2:
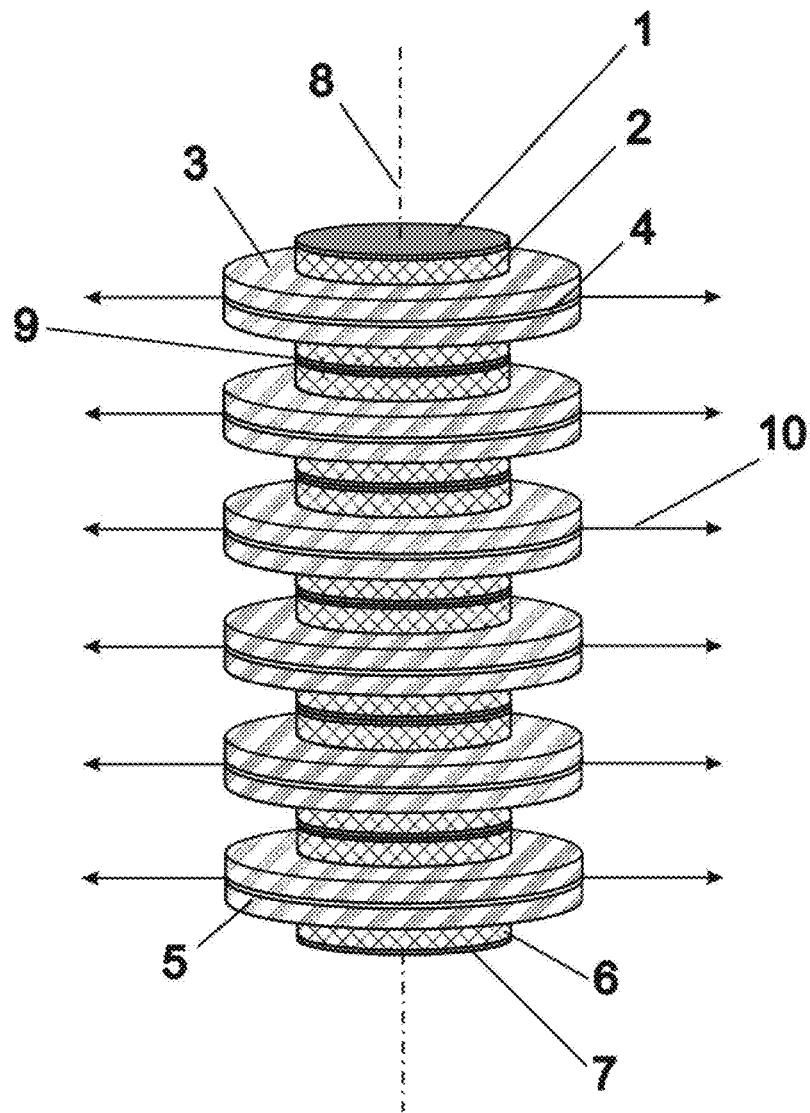
FIG. 2 shows a cylindrical bar of laser diodes having an axis of symmetry and composed of the single laser diodes shown in FIG. 1.

A cylindrical bar of vertically integrated laser diodes with disc optical resonators is shown in FIG. 2. Electrical voltage supplying the cylindrical bar of vertically integrated single diodes is applied through the n-contact 1 of an upper laser diode and through the p-contact 7 of a lower laser diode. A supply voltage of the bar of laser diodes is equal to $V = n \cdot V_{LD}$, where n is a number of the laser diodes in the bar, and $V_{LD}$ is a supply voltage of single laser diode. Choice of the number n of the laser diodes in the bar allows changing the supply voltage V of the bar and provides a suitable matching of the supply voltage V with supply sources and power networks. The upper p-contacts and the lower n-contacts of the neighboring laser diodes are pressed mechanically and form an electric connection 9 between n-contact 1 and p-contact 7. Thus, current supplying the bar of laser diodes flows through the n-contact 1 and p-contact 7 of the laser diodes, then through the contact layers 2 and 6, cladding layers 3 and 5, as well as through the waveguiding layers 4 with active quantum wells of all the laser diodes vertically integrated into the bar. In this case, since the cylindrical bar of laser diodes has an axis of symmetry 8, light 10 therefrom is emitted homogeneously in all directions perpendicular to the axis of symmetry 8.

Figure 3:
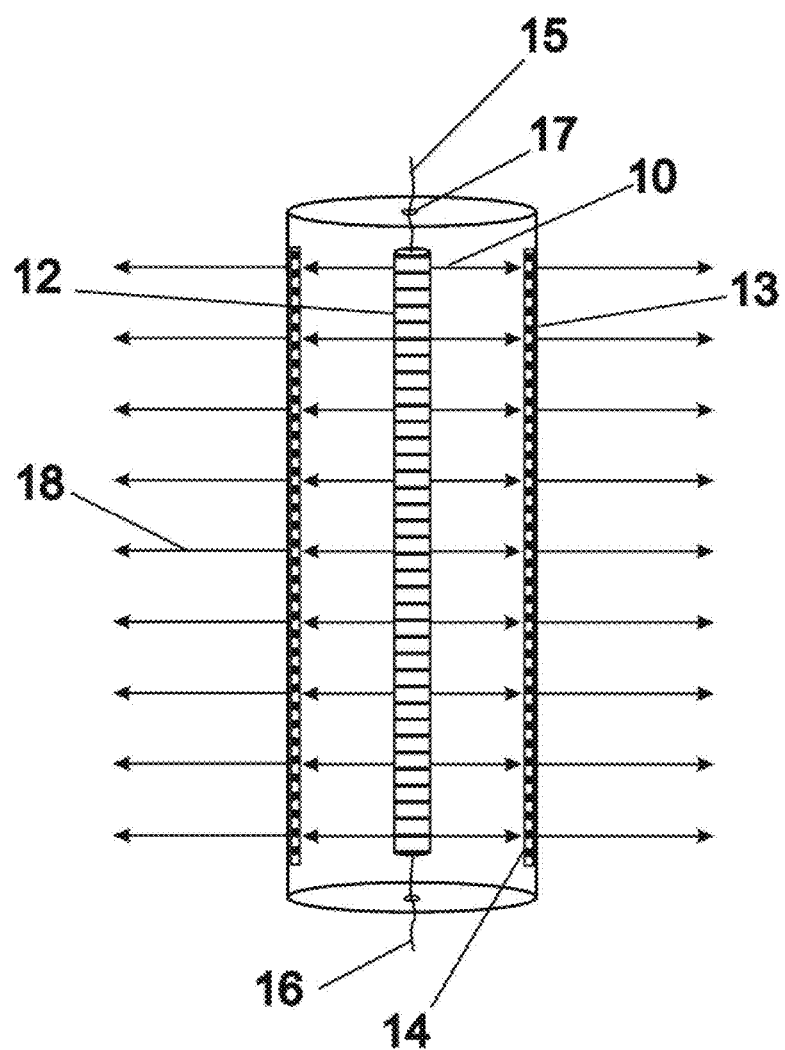
FIG. 3 shows a diagram of a cylindrically symmetric lamp emitting white light and using phosphor for converting ultra-violet or blue radiation into white light, as well as using the bar of laser diodes shown in FIG. 2 as a generator of ultra-violet or blue radiation.

Use of the cylindrical bar of laser diodes as a light source in a cylindrical laser lamp is shown in FIG. 3.

The cylindrical laser lamp consists of a transparent plastic cylinder 13 with phosphor 14 applied on side walls of cylinder, inside of which a cylindrical bar 12 of laser diodes is placed.

When applying a supply voltage V to external wires 15 and 16 passing inside the cylinder 13 through openings 17 and connected to upper and lower contacts of the cylindrical bar 12 of laser diodes, current flowing through the laser bar generates blue light 10 which is emitted homogeneously in all directions perpendicular to the axis of symmetry. In this case a homogeneous flare of phosphor 14, which partially converts blue light into yellow one, is provided, and as a result of mixing of blue and yellow lights, white light 18 goes outwards. Since the whole laser lamp has cylindrical symmetry white light 18 is emitted homogeneously in all directions perpendicular to its axis of symmetry.

Example 2. A Hollow Cylindrical Bar of Ultra-Violet Laser Diodes Used as a Light Source in a Cylindrical Laser Lamp In this example the axially symmetric bar of the laser diodes consists of single laser diodes with a structure $GaN/Al_{0.4}Ga_{0.6}N/Al_{0.2}Ga_{0.8}N/GaN/Al_{0.2}Ga_{0.8}N/Al_{0.4}Ga_{0.6}N/GaN$ with hollow disc optical resonators.

Figure 4:
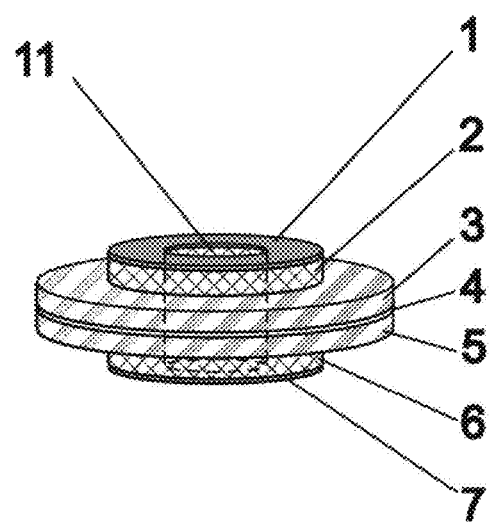
FIG. 4 shows a single laser diode with a hollow disc optical resonator which is a component of the cylindrical bar of laser diodes shown in FIG. 5.

A single laser diode with a hollow disc optical resonator is shown in FIG. 4. It consists of a metal n-contact 1, a contact layer 2 of n-type gallium nitride doped with silicon of concentration $5 \cdot 10^{18}$ cm$^{-3}$ and 2µ thick, a cladding layer 3 of solid solution $Al_{0.4}Ga_{0.6}N$ of n-type 0.5µ thick doped with silicon of concentration $10^{19}$ cm$^{-3}$, waveguiding layer 4 $Al_{0.2}Ga_{0.8}N$ which includes a GaN quantum well 3 nm wide, a cladding layer 5 of solid solution $Al_{0.4}Ga_{0.6}N$ of p-type 0.5µ thick doped with magnum of concentration $10^{20}$ cm$^{-3}$, a contact layer 6 of p-type gallium nitride 0.1µ thick, doped with magnum of concentration $10^{20}$ cm$^{-3}$ and a metal p-contact 7. The laser diode includes a cylindrical cavity 11 passing through all layers of its structure disposed along the axis of symmetry.

Figure 5:
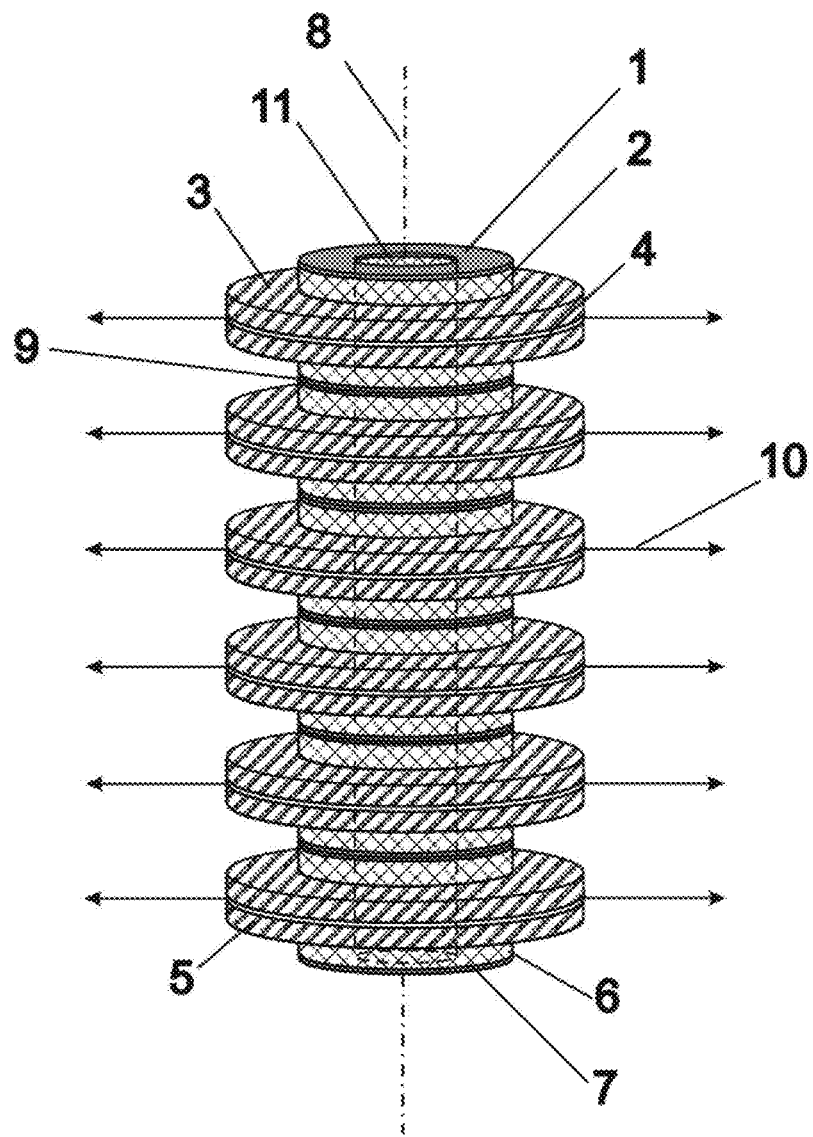
FIG. 5 shows a cylindrical bar of laser diodes with a through cavity having an axis of symmetry and composed of the single laser diodes shown in FIG. 4.

A cylindrical bar of vertically integrated laser diodes with hollow disc optical resonators is shown in FIG. 5. Electrical voltage supplying the cylindrical bar of vertically integrated single diodes is applied through an n-contact 1 of an upper laser diode and through a p-contact 7 of a lower laser diode. A supply voltage of the bar of laser diodes is equal to $V = n \cdot V_{LD}$, where n is a number of the laser diodes in the bar, and $V_{LD}$ is the supply voltage of single laser diode. The choice of the number n of laser diodes in the bar allows changing the supply voltage V of the bar and provides a suitable matching of the supply voltage V with supply sources and power networks. The upper p-contacts and the lower n-contacts of neighboring laser diodes are pressed mechanically and form an electric connection 9 between n-contact 1 and p-contact 7. Thus, current supplying the bar of laser diodes flows through the n-contact 1 and p-contact 7 of the laser diodes, then through the contact layers 2 and 6, the cladding layers 3 and 5, as well as through waveguiding layers 4 with an active quantum well of all laser diodes vertically integrated into the bar. In this case, since the cylindrical bar of laser diodes has the axis of symmetry 8, light 10 therefrom is emitted homogeneously in all directions perpendicular to the axis of symmetry 8. The hollow cylindrical bar of laser diodes includes a cylindrical cavity 11 disposed along the axis of symmetry and passing through all laser diodes. Existence of the cavity 11 allows pumping a cooling liquid through the bar of laser diodes and effectively taking away heat produced in the process of light generation.

Use of the hollow cylindrical bar of laser diodes as a light source in a cylindrical laser lamp is shown in FIG. 3.

The cylindrical laser lamp consists of a transparent plastic cylinder 13 with phosphor 14 applied on side walls of cylinder, inside of which a hollow cylindrical bar 12 of laser diodes is placed.

When applying a supply voltage V to external wires 15 and 16 passing inside the cylinder 13 through openings 17 and connected to upper and lower contacts of the hollow cylindrical bar 12 of laser diodes, current flowing through the laser bar generates ultra-violet light 10 which is emitted homogeneously in all directions perpendicular to the axis of symmetry. In this case a homogeneous flare of phosphor 14, which fully converts ultra-violet light into white one, is provided, and as a result white light 18 goes outwards. A cooling liquid, which passes through the bar of laser diodes and effectively takes away heat produced in process of light generation, is also fed to the cylindrical bar 12 through the openings 17.

Since the whole laser lamp has cylindrical symmetry, white light 18 is emitted homogeneously in all directions perpendicular to its axis of symmetry.

Example 3. A Ring Cylindrical Bar of Blue Laser Diodes Used as a Light Source in a Cylindrical Laser Lamp In this example an axially symmetric bar of laser diodes consists of single laser diodes with a structure $GaN/Al_{0.2}Ga_{0.8}N/GaN/In_{0.2}Ga_{0.8}N/GaN/Al_{0.2}Ga_{0.8}N/GaN$ with ring optical resonators.

Figure 6:
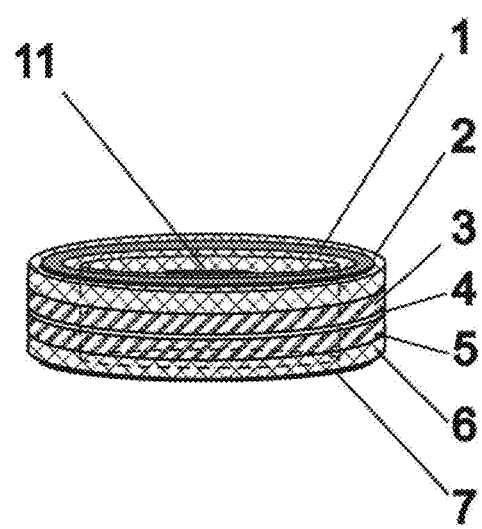
FIG. 6 shows a single laser diode with a ring optical resonator which is a component of the cylindrical bar of laser diodes shown in FIG. 7.

A single laser diode with a ring optical resonator is shown in FIG. 6. It consists of a metal n-contact 1, a contact layer 2 of n-type gallium nitride doped with silicon of concentration $5 \cdot 10^{18}$ cm$^{-3}$ and 2μ thick, a cladding layer 3 of solid solution $Al_{0.2}Ga_{0.8}N$ of n-type 0.5μ thick doped with silicon of concentration $10^{19}$ cm$^{-3}$, a waveguiding layer 4 of gallium nitride which includes $In_{0.2}Ga_{0.8}N$ quantum well 3 nm wide, a cladding layer 5 of solid solution $Al_{0.2}Ga_{0.8}N$ of p-type 0.5μ thick doped with magnum of concentration $10^{20}$ cm$^{-3}$, a contact layer 6 of p-type gallium nitride 0.1μ thick, doped with magnum of concentration $10^{20}$ cm$^{-3}$ and a metal p-contact 7. The laser diode with the ring optical resonator includes a cylindrical cavity 11 passing through all layers of its structure disposed along the axis of symmetry.

Figure 7:
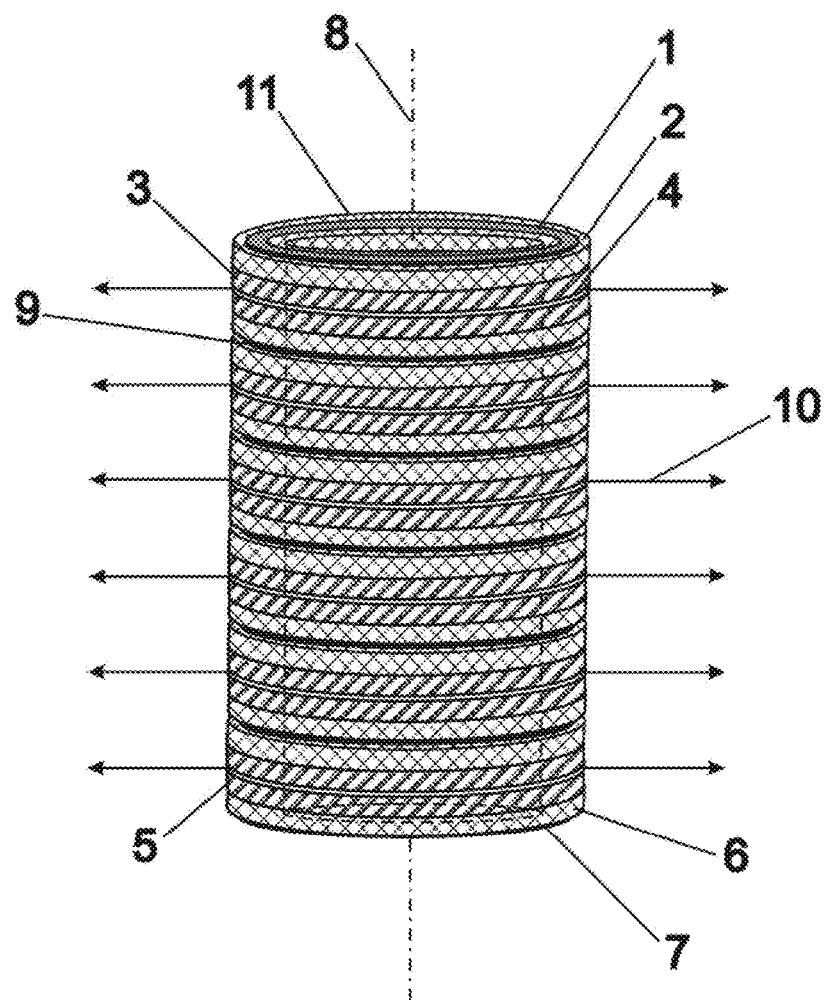
FIG. 7 shows a cylindrical bar of laser diodes with a through cavity having an axis of symmetry and composed of the single laser diodes shown in FIG. 6.

A ring cylindrical bar of vertically integrated laser diodes with ring optical resonators is shown in FIG. 7. Electrical voltage supplying the ring cylindrical bar of vertically integrated single diodes is applied through an n-contact 1 of an upper laser diode and through a p-contact 7 of a lower laser diode. A supply voltage of the bar of laser diodes is equal to $V=n \cdot V_{LD}$, where n is a number of laser diodes in the bar, and $V_{LD}$ is the supply voltage of the single laser diode. A choice of the number n of the laser diodes in the bar allows changing the supply voltage V of the bar and provides a suitable matching of the supply voltage V with supply sources and power networks. The upper p-contacts and the lower n-contacts of neighboring laser diodes are pressed mechanically and form an electric connection 9 between n-contact 1 and p-contact 7. Thus, current supplying the bar of laser diodes flows through the n-contact 1 and p-contact 7 of the laser diodes, then through the contact layers 2 and 6, the cladding layers 3 and 5, as well through the waveguiding layers 4 with an active quantum well of all the laser diodes vertically integrated into the bar. In this case, since the cylindrical bar of laser diodes has the axis of symmetry 8, light 10 therefrom is emitted homogeneously in all directions perpendicular to the axis of symmetry 8. The ring cylindrical bar of laser diodes includes a cylindrical cavity 11 disposed along the axis of symmetry and passing through all laser diodes. Existence of the cavity 11 allows pumping a cooling liquid through the bar of laser diodes and effectively taking away of heat produced in the process of light generation.

Use of a ring cylindrical bar of laser diodes as a light source in a cylindrical laser lamp is shown in FIG. 3.

The cylindrical laser lamp consists of a transparent plastic cylinder 13 with phosphor 14 applied on side walls of cylinder, inside of which a ring cylindrical bar 12 of laser diodes is placed.

When applying a supply voltage V to external wires 15 and 16 passing inside the cylinder 13 through openings 17 and connected to upper and lower contacts of the cylindrical bar 12 of laser diodes, current flowing through the laser bar generates blue light 10 which is emitted homogeneously in all directions perpendicular to the axis of symmetry. In this case a homogeneous flare of phosphor 14, which partially converts blue light into yellow one, is provided and as a result of mixing blue and yellow lights, white light 18 goes outwards. A cooling liquid, which passes through the bar of laser diodes and effectively takes away heat generated in the process of light generation, is also fed to the ring cylindrical bar 12 through the openings 17.

Since the whole laser lamp has cylindrical symmetry, white light 18 is emitted homogeneously in all directions perpendicular to its axis of symmetry.

Example 4. A Hollow Hexagonal Bar of Ultra-Violet Laser Diodes Used as a Light Source in a Cylindrical Laser Lamp In this example a bar of laser diodes consists of single laser diodes with a structure $GaN/Al_{0.4}Ga_{0.6}N/Al_{0.2}Ga_{0.8}N/GaN/Al_{0.2}Ga_{0.8}N/Al_{0.4}Ga_{0.6}N/GaN$ with hollow hexagonal optical resonators.

Figure 8:
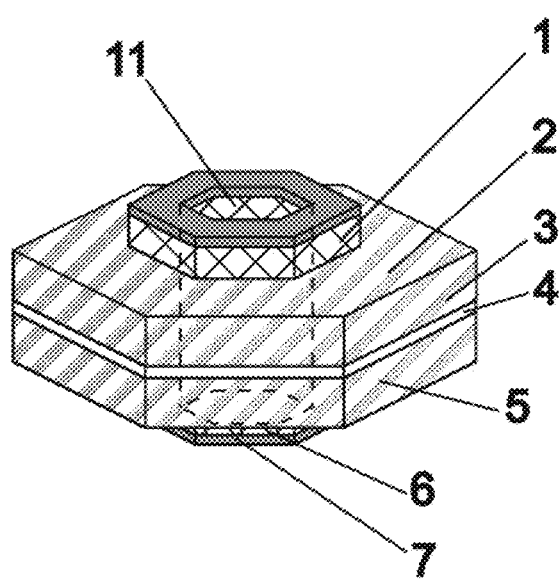
FIG. 8 shows a single laser diode with a hexagonal resonator which is a component of the hexagonal bar of laser diodes shown in FIG. 9.

A single laser diode with a hollow hexagonal optical resonator is shown in FIG. 8. It consists of a metal n-contact 1, a contact layer 2 of n-type gallium nitride doped with silicon of concentration $5 \cdot 10^{18}$ cm$^{-3}$ and 2μ thick, a cladding layer 3 of solid solution $Al_{0.4}Ga_{0.6}N$ of n-type 0.5μ thick doped with silicon of concentration $10^{19}$ cm$^{-3}$, a waveguiding layer 4 $Al_{0.2}Ga_{0.8}N$ which includes a GaN quantum well 3 nm wide, a cladding layer 5 of solid solution $Al_{0.4}Ga_{0.6}N$ of p-type 0.5μ thick doped with magnum of concentration $10^{20}$ cm$^{-3}$, a contact layer 6 of p-type gallium nitride 0.1μ thick, doped with magnum of concentration $10^{20}$ cm$^{-3}$ and a metal p-contact 7. The laser diode includes a hexagonal cavity 11 passing through all layers of its structure disposed along the axis of symmetry.

Figure 9:
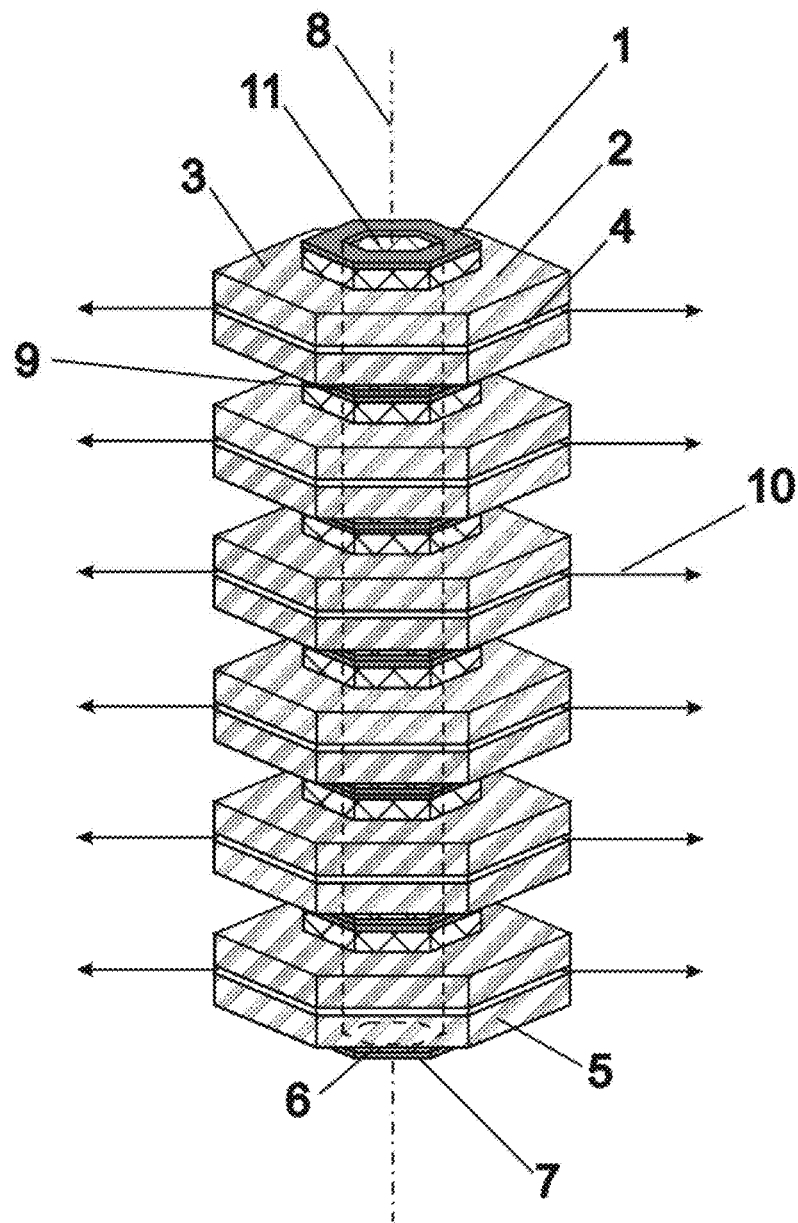
FIG. 9 shows a hexagonal bar of laser diodes with a through hexagonal cavity having an axis of sixth order symmetry and composed of the single laser diodes shown in FIG. 8.

A hollow hexagonal bar of the vertically integrated laser diodes with hollow hexagonal optical resonators is shown in FIG. 9. Electrical voltage supplying the cylindrical bar of vertically integrated single diodes is applied through an n-contact 1 of an upper laser diode and through a p-contact 7 of a lower laser diode. A supply voltage of the bar of laser diodes is equal to $V=n \cdot V_{LD}$, where n is a number of laser diodes in the bar, and $V_{LD}$ is the supply voltage of a single laser diode. Choice of the number n of laser diodes in the bar allows changing the supply voltage V of the bar and provides a suitable matching of the supply voltage V with supply sources and power networks. The upper p-contacts and the lower n-contacts of neighboring laser diodes are pressed mechanically and form the electric connection 9 between n-contact 1 and p-contact 7. Thus, current supplying the bar of laser diodes flows through the n-contact 1 and p-contact 7 of the laser diodes, then through the contact layers 2 and 6, the cladding layers 3 and 5, as well as through the waveguiding layers 4 with an active quantum well of all laser diodes vertically integrated into the bar. In this case, since the hollow hexagonal bar of laser diodes has the axis of symmetry 8, light 10 therefrom will is emitted almost homogeneously in all directions perpendicular to the axis of symmetry 8. The hollow hexagonal bar of laser diodes includes a hexagonal cavity 11 disposed along the axis of symmetry and passing through all laser diodes. Existence of the cavity 11 allows pumping a cooling liquid through the bar of laser diodes and effectively taking away heat produced in the process of light generation.

Use of a hollow hexagonal bar of laser diodes as a light source in a cylindrical laser lamp is shown in FIG. 3.

The cylindrical laser lamp consists of a transparent plastic cylinder 13 with phosphor 14 deposited on side walls of the cylinder, inside of which a hollow hexagonal bar 12 of laser diodes is placed.

When applying supply voltage V to external wires 15 and 16 passing inside the cylinder 13 through openings 17 and connected to upper and lower contacts of the hollow cylindrical bar 12 of laser diodes, current flowing through the laser bar generates ultra-violet light 10 which is emitted almost homogeneously in all directions perpendicular to the axis of symmetry. In this case almost homogeneous flare of phosphor 14 which fully converts ultra-violet light into white one is provided and, as a result, white light 18 goes outwards. A cooling liquid, which passes through the bar of laser diodes and effectively takes away heat produced in the process of light generation, is also fed to the hollow hexagonal bar 12 through the openings 17.

Since the whole laser lamp possesses the axis of the six order symmetry, white light 18 is emitted almost homogeneously in all directions perpendicular to its axis of symmetry.

Despite the fact that this invention has been described and represented by the examples of the invention embodiments, it should be noted that this invention is not limited by the given examples in any case.

What is claimed is:

1. A semiconductor light-emitting device having an axis of symmetry, the device comprising two or more laser diodes each of the laser diodes has an axis of symmetry wherein the laser diodes are arranged in series on the axis of symmetry of the light-emitting device in such a way that their axes of symmetry coincide, wherein faces of the laser diodes are connected such that they are in electrical and mechanic contact and form a bar of laser diodes, a directional pattern of radiation of the laser diodes has an axis of symmetry coinciding with the axis of symmetry of the light-emitting device and is directed perpendicularly to the axis of symmetry of the light-emitting device, wherein light is emitted from each of the laser diodes homogeneously in all directions perpendicular to the axis of symmetry of the semiconductor light-emitting device.

2. The semiconductor light-emitting device according to claim 1, wherein each of the laser diodes has a disk optical resonator.

3. The semiconductor light-emitting device according to claim 1, wherein each of the laser diodes has a hollow disk optical resonator.

4. The semiconductor light-emitting device according to claim 1, wherein each of the laser diodes has a ring optical resonator.

5. The semiconductor light-emitting device according to claim 1, wherein each of the laser diodes has a polygonal optical resonator.

6. The semiconductor light-emitting device according to claim 1, wherein each of the laser diodes has a hollow polygonal optical resonator.

7. The semiconductor light-emitting device according to claim 1, wherein each of the laser diodes is made of III-nitrides.

8. The semiconductor light-emitting device according to claim 1, wherein the light is a source of visible or ultra-violet light.

9. A laser lamp with a phosphor, wherein the lamp comprises a semiconductor light-emitting device having an axis of symmetry, the device comprising two or more laser diodes, each of the laser diodes has an axis of symmetry wherein the laser diodes are arranged in series on the axis of symmetry of the light-emitting device in such a way that their axes of symmetry coincide, wherein faces of the laser diodes are connected such that they are in electrical and mechanic contact and form a bar of laser diodes, a directional pattern of radiation of the laser diodes has an axis of symmetry coinciding with the axis of symmetry of the light-emitting device and is directed perpendicularly to the axis of symmetry of the light-emitting device, wherein light is emitted from each of the laser diodes homogeneously in all directions perpendicular to the axis of symmetry of the semiconductor light-emitting device, the device being a source of the light for optical excitation of the phosphor.

10. The laser lamp according to claim 9, wherein the lamp has an axis of symmetry, the light-emitting device placed inside the lamp in such a way that the axis of symmetry of the light-emitting device and the axis of symmetry of the lamp coincide so that the light of the device optically excites the phosphor that results in white light being emitted homogeneously in all directions perpendicular to the axis of symmetry of the lamp.

11. The laser lamp according to claim 9, wherein the lamp comprises a cylinder having an axis of symmetry, the light-emitting device placed inside cylinder in such a way that the axis of symmetry of the light-emitting device and the axis of symmetry of the cylinder coincide, the phosphor disposed on exterior of the cylinder so that the light of the device optically excites the phosphor that results in white light being emitted homogeneously in all directions perpendicular to the axis of symmetry of the cylinder.

12. The laser lamp according to claim 9, wherein each of the laser diodes of the device has a disk optical resonator.

13. The laser lamp according to claim 9, wherein each of the laser diodes of the device has a hollow disk optical resonator.

14. The laser lamp according to claim 9, wherein each of the laser diodes of the device has a ring optical resonator.

15. The laser lamp according to claim 9, wherein each of the laser diodes of the device has a polygonal optical resonator.

16. The laser lamp according to claim 9, wherein each of the laser diodes of the device has a hollow polygonal optical resonator.

17. The laser lamp according to claim 9, wherein each of the laser diodes of the device is made of III-nitrides.

18. The laser lamp according to claim 9, wherein the light is a source of visible or ultra-violet light.

* * * * *